United States Patent
Wang

[19]

[11] Patent Number: 5,948,203
[45] Date of Patent: Sep. 7, 1999

[54] OPTICAL DIELECTRIC THICKNESS MONITOR FOR CHEMICAL-MECHANICAL POLISHING PROCESS MONITORING

[75] Inventor: Shih-Ming Wang, Hsin-Chu, Taiwan

[73] Assignee: Taiwan Semiconductor Manufacturing Company, Ltd., Hsin-Chu, Taiwan

[21] Appl. No.: 08/688,070

[22] Filed: Jul. 29, 1996

[51] Int. Cl.[6] .................................................. B24B 49/00
[52] U.S. Cl. ........................................ 156/345; 451/287
[58] Field of Search .................................. 451/287, 288; 438/691, 692, 693; 156/345

[56] References Cited

U.S. PATENT DOCUMENTS

| | | | |
|---|---|---|---|
| 4,897,015 | 1/1990 | Abbe et al. | 414/744.8 |
| 5,413,941 | 5/1995 | Koos et al. | 437/8 |
| 5,492,594 | 2/1996 | Burke et al. | 216/86 |
| 5,595,527 | 1/1997 | Appeal et al. | 451/28 |
| 5,643,044 | 7/1997 | Lund | 451/5 |
| 5,655,954 | 8/1997 | Oishi et al. | 451/67 |
| 5,658,183 | 8/1997 | Sandhu et al. | 451/5 |
| 5,664,987 | 9/1997 | Renteln | 451/21 |

*Primary Examiner*—Bruce Breneman
*Assistant Examiner*—Rudy Zervignon
*Attorney, Agent, or Firm*—George O. Saile; Stephen B. Ackerman

[57] ABSTRACT

An apparatus for chemical-mechanical-polishing(CMP) is described which employs a dedicated optical film thickness monitor for quasi in-situ assessment of the thickness of a dielectric film on an integrated circuit wafer during CMP operations involving planarization and polish-back. The wafers being polished remain mounted on the CMP wafer carrier and are transported from the polishing platen to the optical film thickness measuring device by an integral mechanical transport assembly which can be operated either manually or automatically by a computer. Real-time polishing rates are determined after each polish/measurement cycle so that time variant polishing rates are redressed.

22 Claims, 4 Drawing Sheets

OPTICAL DIELECTRIC THICKNESS MONITOR FOR CHEMICAL-MECHANICAL POLISHING PROCESS MONITORING

BACKGROUND OF THE INVENTION (1) Field of the Invention

The invention relates to processes for the manufacture of semiconductor devices and more particularly to processes related to the chemical-mechanical-planarization of semiconductor wafers.

(2) Description of Prior Art

The fabrication of integrated circuits not only involves the forming of semiconductor devices within the surface of a semiconductor wafer but also the creation of a complex network of wiring interconnections which comprise the electrical circuitry of the completed chip. These interconnections are accomplished by the alternate deposition of thin layers of conductive and insulating materials over the semiconductor devices. Each conductive layer is patterned by photolithographic techniques to form the wiring design for that level. This patterning process produces a surface with topological features, which, if no steps were taken, would replicate itself in each succeeding layer.

Conductive layers are usually metals such as aluminum, are deposited by physical-vapor-deposition(PVD) techniques such as vacuum evaporation or sputtering. These methods do not provide conformal coverage and the presence of topological features on the surface onto which they are deposited result in non-uniformities in thickness and other problems related to the shadowing effects of non-planar surfaces.

Frequently two to four levels of interconnection metallurgy are required to form the required circuits. In order to provide a planar surface for each level of metal, various methods have been used to planarize the insulator surface. Glasses which flow when heated are commonly used to accommodate the first layer of metallization. Subsequent levels where elevated temperatures are no longer permissible, employ layers of materials which are deposited as liquids and then cured to form solid layers. Such layers of spin-on-glasses and organic polymers provide an improved local surface planarity. Subsequent reactive-ion-etching (RIE) removes the polymers and translates the new surface to the insulating layer.

Although these methods can provide great refinement to local planarization, they cannot provide planarization over a large area. This is because the integrated circuit chips themselves contain discrete regions of different topological complexity such as memory arrays located within regions of logic circuits.

Recent years have seen an increased interest in adapting the technique which is used to provide the wafer with a planar surface in the first place—chemical-mechanical-polishing(CMP). At first thought, a seemingly crude method for dealing with dimensions of the order of hundredths of a micron, the technique has been refined and utilized with much success in recent years.

One of the difficulties with this method is the monitoring of its progress and the determination of when the polishing process should be terminated. In general, the tool used for CMP consists of a large circular rotatable platen fitted with a soft pad onto which a slurry of fine particles and a chemical etchant is continuously applied. The wafer being polished or planarized is mounted up-side down on a smaller rotating disk which places it in contact and under controlled pressure with the polishing pad of the platen.

Periodic calibration of polishing rates using monitor wafers is not practical with CMP. Because of polishing pad wear the polishing rates are time dependent as is shown by the declining removal rate RR with wafer count in FIG. 1. Each wafer should have its film thickness measured periodically during the CMP process and instantaneous removal rates determined to avoid over-polishing. This seemingly tedious procedure is rewarded by the elimination of ruined wafers and the avoidance of re-work.

True in-situ observation of the surface of the wafer under these conditions is possible only if the large polishing table is fitted the observation device itself or with an opening through which the observation device may operate. Such observations typically require extensive calibration and employ indirect means for determining the desired monitoring parameter. By and large, true in-situ methods focus attention on a single wafer site only. Generally, these methods, which measure capacitive or conductive changes, require elaborate calibration and do not have the sensitivity which optical thickness measurements can provide.

Non in-situ techniques require polishing for a period of time over the polishing platen, moving the wafer assembly to a measurement station, measuring the remaining layer thickness or degree of planarity, and then returning the wafer assembly to the polishing platen. Such monitoring techniques, although disruptive of the polishing process and non-periodic, have advantages which make them uniquely practical in some instances.

Burke et.al. U.S. Pat. No. 5,492,594 describes an apparatus with a separate measurement station wherein the wafer carrier is mounted on a moveable support arm which can rotate the assembly from the polishing position over the rotating platen to a measurement position over a plurality of electrodes contained in an electrolyte. The capacitance of the dielectric layer is measure and associated with the thickness of the dielectric layer. This method requires careful calibration and does not make a direct thickness measurement at a discrete location.

Other techniques which may be called "quasi" in-situ make use of periodic off-table excursions of the rotating wafer carrier head. These excursions are part of a linear travel of the wafer carrier head along the radius of the polishing platen during normal operation. When the carrier travels part way off the polishing platen the wafer surface is exposed and a measurement can be made. Such measurements are periodic and sufficiently frequent to provide useful monitoring capability.

One such a technique is described by Koos et.al., U.S. Pat. No. 5,413,941. Here the wafer being polished is faced against a mirror as it comes off-platen. Laser light is passed transversely between the wafer surface and the mirror, causing multiple reflections between mirror and wafer. A detector at the opposite side records the linear intensity signature of the wafer surface from the exit beam. This signal is a direct measure of the degree of surface planarity and as such provides an excellent monitor of the planarization process. The Koos et. al. mirror technique is also applicable to a separate measurement station process.

The preceding technique and many others relate only to the achievement of planarity regardless of the thickness of the remaining dielectric layer. The technological trend toward smaller device geometries has driven layer thicknesses to smaller dimensions. Thus, as CMP for planarization and etchback purposes continues to mature, the requirements put upon it become more demanding. Monitoring and end-point detection of planarity alone are no longer sufficient. Not only must planarity be achieved but also the layer must be further polished to meet a specified thickness. In some instances, a final thickness specification may take precedence over perfect planarity.

SUMMARY OF THE INVENTION

It is an object of this invention to describe an efficient and reliable apparatus for measuring and monitoring the thickness of a dielectric layer residing on a substrate wafer during CMP. The apparatus can be operated manually or it can be mechanized and computer controlled to make it operate in a quasi in-situ mode. The dielectric layer, as deposited, contains a surface topology which is to be planarized by the CMP. After planarization is achieved the thickness of the dielectric layer is further reduced by CMP to a specified amount. The optical method used by this invention provides timely thickness measurements of the remaining dielectric layer by observing thickness at a discrete location on the wafer.

The apparatus consists of a CMP platen assembly with a wafer carrier which spins the wafer as it is held against the rotating polishing pad. A dedicated optical thickness measurement device is located adjacent to the platen assembly and the wafer is periodically lifted from the polishing pad by applying vacuum to the wafer carrier, and transported to the measurement device. Here a thickness measurement is made, a removal rate computed, and the wafer is returned to the polishing pad. The subsequent polishing time is determined from the just determined removal rate.

It is a further object of this invention to describe the configuration of this apparatus so that its operation can be accomplished under the control of a computer.

It is another object of this invention to practice the use of this monitoring method in such a way as to indicate when sufficient polishing has been achieved, not only for the purposes of planarization, but also for reaching but not overshooting a target thickness of the dielectric layer being polished.

DESCRIPTION OF THE PREFERRED EMBODIMENTS

Figure 1:
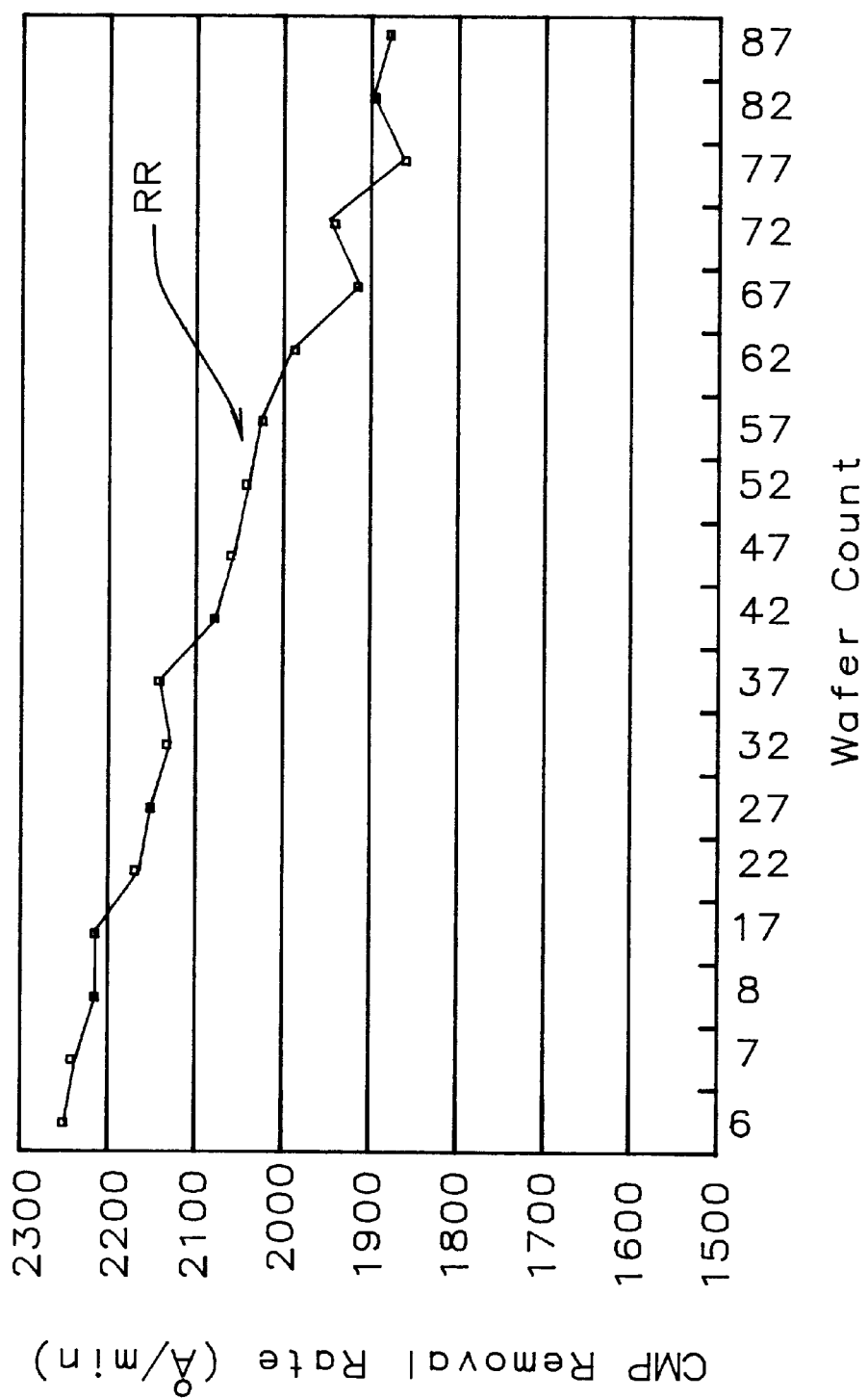
FIG. 1 is a chart showing the removal rate of a dielectric layer by CMP as a function of the number of wafers processed.
Figure 2:
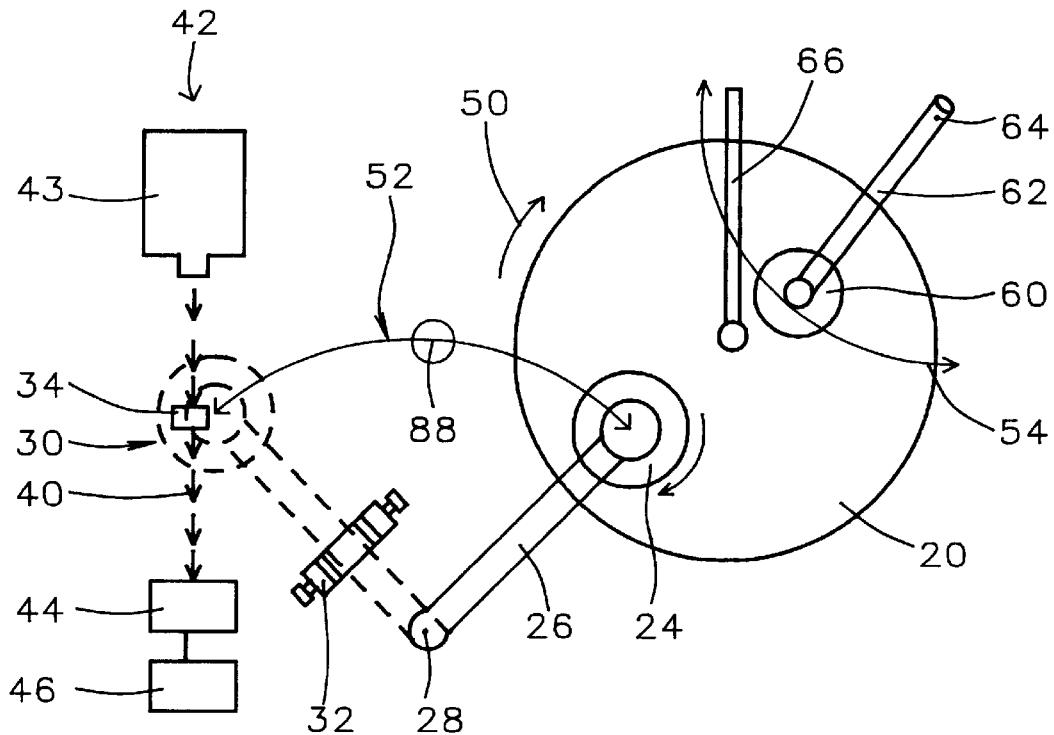
FIG. 2 is a top view of the apparatus described in a first embodiment of this invention.
Figure 3:
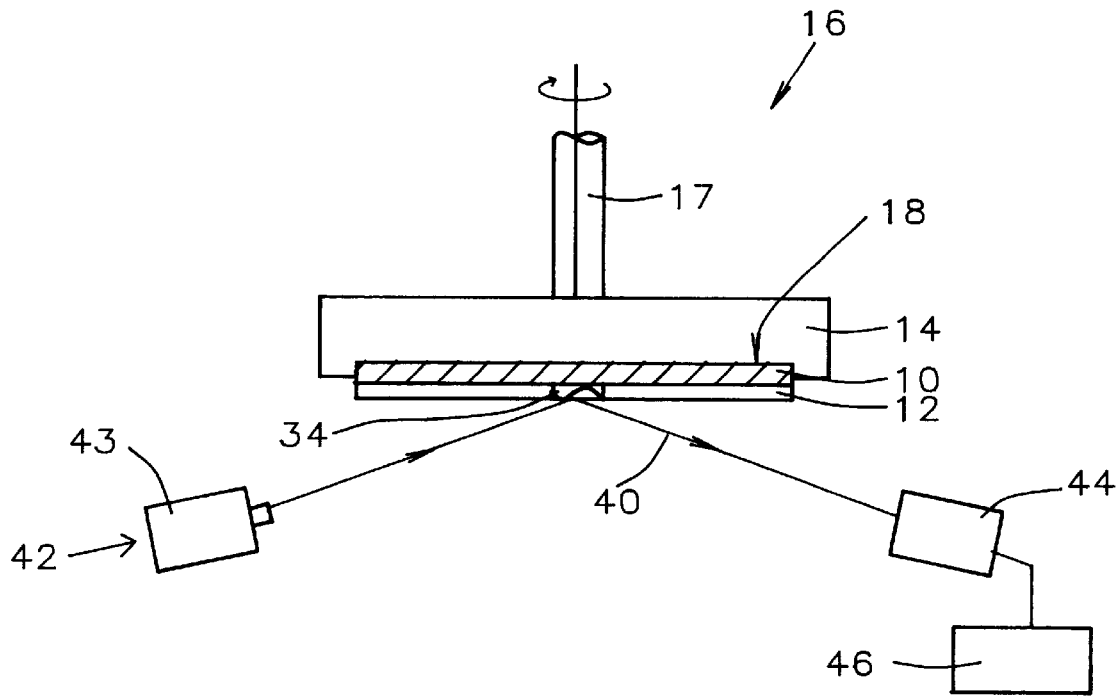
FIG. 3 is a cross sectional view of the wafer carrier showing a mounted wafer and the optical observation layout.

Accordingly, referring to FIG. 2, there is shown a top view of the essential features of a first embodiment of the CMP apparatus taught by this invention. A large flat rotatable platen 20, typical of CMP stations is covered with a porous polishing pad and rotated by a variable speed motor (not shown) in the direction 50. The wafer 10 being polished is held face down in the chuck of the rotatable wafer carrier 24. The wafer carrier spindle 16 is shown in cross section in FIG. 3 and comprises a wafer chuck 14 attached to a shaft 17. The spindle 16 is provided with vacuum source to retain the wafer 10 to its under surface within a recess 18. The recess 18 has a sense which mates the orientation notching of the wafer edge thereby fixing the orientation of the wafer 10 with respect to the wafer carrier spindle 16. Vacuum is applied during the time that the wafer carrier is off the polishing platen. During the polishing period, the vacuum is removed to allow uniform pressure to be applied against the polishing pad. The spindle 16 is rotated by a variable speed motor(not shown). An additional servo motor is provided on the wafer carrier 24 which engages the spindle 16 when the spindle motor stops. It returns the spindle 16 to a pre-set (home) position with respect to the wafer carrier body. This position is determined by a detent switch located on the wafer carrier 24. The wafer orientation is thus aligned to the carrier body 24.

Referring again to FIG. 2, the wafer carrier 24 is supported by an arm 26 which is attached to a pivot 28, thereby allowing it to rotate the wafer carrier 24 through an arc 52. Along this arc 52 the wafer carrier 24 moves through radial positions over the polishing platen 20 as well as off the platen to a station 30 where it can be held to a fixed position by an adjustable positioner 32. A rinse station 88, which removes residual slurry from the wafer surface prior to the thickness measurement is not always required when a dedicated thickness monitor such as the one described here is used. However, it could be included at a position within the arc of travel of the wafer carrier 24 intermediate between the polishing platen 20 and the measurement position 30. While at position 30, the carrier motor rotates a pre-selected reference site 34 (FIG. 3) on the wafer into the beam path 40 of an optical thickness monitor 42. The device includes a light source 43 and a detector 44. The reference site 34 typically consists of an un-patterned die or a registration mark used for photomask alignment. The reference site provides an area with uniform thickness of the dielectric layer to be polished which is preferably at the same level as that over the patterned sites.

Other features of the polishing arrangement include a polishing pad conditioner 60 mounted on a movable arm 62 rotating over the arc 54 with a pivot at 64 and a dispenser of polishing slurry 66. These features are common to CMP practice and need not be discussed here.

The output signal from the detector 44 is delivered to a dedicated computer 46 which converts it to a layer thickness. This conversion may be also be included as part of the detector electronics. After an initial thickness has been determined an initial polishing time period is computed based on calibration data and a pre-determined monitoring recipe.

Figure 4:
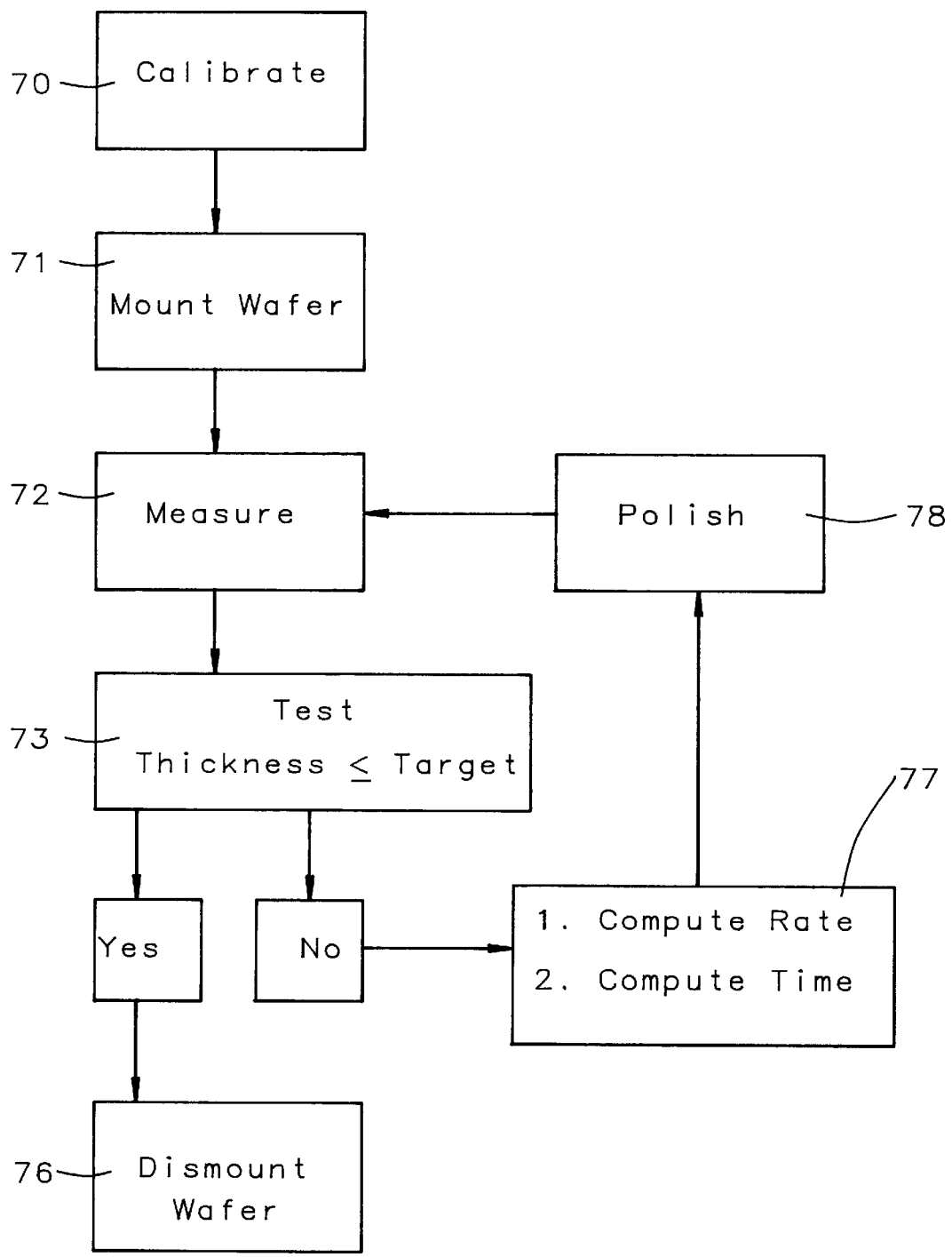
FIG. 4 is a flow chart showing a typical sequence of steps used to exercise the process of this invention.

Referring now to FIG. 4 there is shown a flow chart depicting the sequence of steps for a typical polishing operation. The calibration procedure 70 may be performed only once prior to the processing of a group of wafers consisting of, for example, a job lot having all the same product. This procedure includes calibration of the optical thickness monitor with a wafer having a reference site of known dielectric thickness, adjusting the positioner 32(FIG. 2), and loading a polishing sequence recipe and reference data into the computer to accommodate the wafers of the job.

The first wafer of the job is then mounted 71 into the wafer carrier, locked on by vacuum, and positioned at the measurement station 30, An initial measurement is made of the thickness at the reference site 34 and the carrier arm is rotated to the polishing position. Polishing 78 proceeds for the time prescribed by the computer and the wafer is returned to the measurement station 72 and a second measurement is made. The computer then calculates a polishing rate and an computes the next polishing time period 77. This cycle is repeated, each time comparing the measurement thickness to the target thickness 73, re-computing polishing rate and determining a new polishing time. When the test 73 indicates end point, the wafer is dismounted 76, a new wafer is mounted, and the process is started anew. As the measured thickness approaches the target thickness, the computed polishing time periods become smaller according to the recipe stored in the computer.

In the first embodiment of this invention the wafer carrier 24 is manually moved from the polishing station to the measurement station and back. In a second embodiment, referring again to FIG. 2 and FIG. 3, the computer 46 is fitted with an instrument control bus which allows it to operate a first servo-motor which moves the arm 26 and a second servo motor which raises an lowers the wafer carrier assembly 24. Additionally, the computer operates an electric valve which applies vacuum to the wafer carrier 24 to grasp the wafer. The servo motor which rotates the wafer 10 to its home position is not operated by the computer. Its operation is triggered by the cessation of the spindle motor After a wafer 10 has been affixed to the wafer carrier chuck 14, the computer 46 activates the first servo motor which moves the wafer carrier arm 26 over the measurement station and causes the spindle motor to stop. This triggers the return of the wafer 10 to its home position wherein the reference site 34 is in the measurement position. The computer 46 then senses the output of the detector 44 to obtain a thickness measurement. Next the first servo-motor returns the wafer carrier to the polishing position, restarts the spindle motor, causes the second servo motor to lower the wafer onto to the polishing pad, and releasing the vacuum. For this embodiment the arm positioner 32 shown in FIG. 2 is not required.

Figure 5:
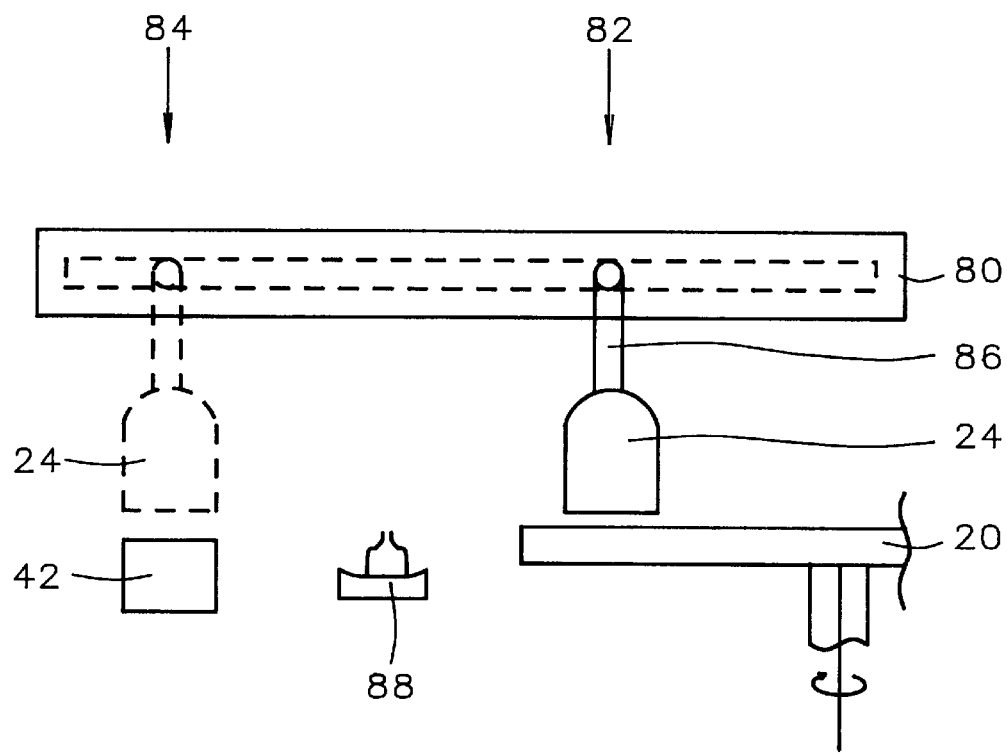
FIG. 5 is a view of a layout of the CMP apparatus according to a third embodiment of this invention.

A third embodiment of this invention is illustrated by FIG. 5. Here the wafer carrier 24 is mounted on a cradle 86 which travels along a track 80 positioned over a portion of the polishing platen 20 and the measurement position of the optical thickness monitor 42. The wafer carrier assembly 24 is driven along the track by a servo motor which allows continuous travel of the wafer carrier from a location 82 over the polishing platen to location 84 at the thickness monitor 42. A rinse station 88 may also be included if required, to clear away polishing slurry prior to thickness measurement.

While this invention has been particularly shown and described with reference to the preferred embodiments thereof, it will be understood by those skilled in the art that various changes in form and details may be made without departing from the spirit and scope of the invention.

What is claimed is:

1. An apparatus for chemical-mechanical-polishing (CMP) of a layer of dielectric material on a wafer substrate comprising:

a rotatable flat CMP platen assembly with slurry dispensing mechanism and pad conditioner;

a measurement station fitted with an optical thickness measuring tool a rotatable wafer carrier, with a vacuum operated wafer chuck, supported on a pivoted mechanical arm, said pivoted mechanical arm permitting said rotatable wafer carrier to travel along an arc permitting a wafer mounted on said chuck to be alternately positioned on said CMP platen assembly and in a measurement position at said measurement station; and an adjustable arm positioner.

2. The apparatus of claim 1 wherein said rotatable wafer carrier is fitted with a variable speed motor with a spindle and a detent operated servo motor which automatically returns said spindle to an adjustable home position when said variable speed motor is stopped.

3. The apparatus of claim 1 wherein said optical thickness measuring device comprises a collimated variable wavelength light source and a photo detector with a signal intensity output.

4. The apparatus of claim 3 wherein said collimated variable wavelength light source reflects a beam of light from a designated area on said wafer attached to said rotatable wafer carrier and onto said photo detector.

5. The apparatus of claim 4 wherein said signal intensity output of said photo detector is a measure of thickness of a dielectric layer over said designated area on said wafer.

6. The apparatus of claim 4 further comprising:

a first servo-motor to operate said pivoted mechanical arm;

a second servo motor to raise and lower said rotatable wafer carrier;

an electrically operated valve to apply and release vacuum to said wafer chuck; and a computer with an instrument controlling interface bus to direct and control the movements of said rotatable wafer carrier.

7. The apparatus of claim 6 wherein said computer operates said first servo motor, said second servo motor, and said electrically operated valve as directed by a program which receives input data from said signal intensity output of said photo detector.

8. The apparatus of claim 1 further comprising a rinse station located under said arc of said pivoted mechanical arm.

9. The apparatus of claim 8 wherein said rinse station is located between said CMP platen assembly and said optical thickness measuring device.

10. An apparatus for chemical-mechanical-polishing (CMP) of a layer of dielectric material on a wafer substrate comprising:

a rotatable flat CMP platen assembly with slurry dispensing mechanism and pad conditioner;

a measurement station fitted with an optical thickness measuring tool;

a rotatable wafer carrier, with a vacuum operated wafer chuck, supported by a cradle which travels along a track permitting a wafer mounted on said wafer chuck to be alternately positioned on said CMP platen assembly and in a measurement position at said measurement station;

a first servo-motor to move said rotatable wafer carrier along said track;

a second servo motor to raise and lower said rotatable wafer carrier; and a computer with an instrument controlling interface bus to direct and control the movements of said rotatable wafer carrier.

11. The apparatus of claim 10 wherein said rotatable wafer carrier is fitted with a variable speed motor with a spindle and a detent operated servo motor which automatically returns said spindle to an adjustable home position when said variable speed motor is stopped.

12. The apparatus of claim 10 wherein said optical thickness measuring device comprises a collimated variable wavelength light source and a photo detector with a signal intensity output.

13. The apparatus of claim 12 wherein said collimated variable wavelength light source reflects a beam of light from a designated area on said wafer attached to said rotatable wafer carrier and onto said photo detector.

14. The apparatus of claim 13 wherein said signal intensity output of said photo detector is a measure of thickness of a dielectric layer over said designated area on said wafer.

15. The apparatus of claim 10 further comprising a rinse station located under said track.

16. The apparatus of claim 15 wherein said rinse station is located between said CMP platen assembly and said optical thickness measuring device.

17. A method for performing chemical-mechanical polishing on a silicon wafer having a dielectric layer formed over its surface comprising:
  (a) providing a CMP apparatus having:
    a rotatable flat CMP platen assembly,
    a rotatable wafer carrier with a vacuum chuck,
    a proximal optical thickness measuring device, and
    an integral mechanical means for transport of said rotatable wafer carrier between said CMP platen assembly and said proximal optical thickness measuring device;
  (b) providing a silicon wafer having a designated thickness measurement site and a dielectric layer formed over its surface;
  (c) mounting said silicon wafer onto said vacuum chuck;
  (d) applying vacuum to said vacuum chuck;
  (e) causing said integral mechanical means of transport to position said rotatable wafer carrier over said optical thickness measuring device;
  (f) rotating said rotatable wafer carrier to position said designated thickness measurement site;
  (g) recording a first thickness measurement;
  (h) computing a polishing time interval;
  (i) initiating rotation of said rotatable wafer carrier and said CMP platen assembly;
  (j) causing said integral mechanical means of transport to position and lower said silicon wafer onto said CMP platen assembly;
  (k) releasing vacuum;
  (l) polishing said silicon wafer for said polishing time interval;
  (m) applying vacuum;
  (n) causing said integral mechanical means of transport to raise said rotatable wafer carrier;
  (o) ceasing rotation of said rotatable wafer carrier;
  (p) causing said integral mechanical means of transport to position said rotatable wafer carrier over said optical thickness measuring device;
  (q) rotating said rotatable wafer carrier to position said designated thickness measurement site;
  (r) recording a second thickness measurement;
  (s) computing a removal rate;
  (t) re-computing said polishing time interval;
  (u) repeating steps (i) through step (t) until a target thickness is reached; and
  (v) removing said silicon wafer from said rotatable wafer carrier.

18. The method of claim 17 wherein said integral mechanical means of transport is a pivoted mechanical arm.

19. The method of claim 17 wherein said integral mechanical means of transport is a cradle carrying said rotatable wafer carrier along a track.

20. The method of claim 17 wherein said proximal optical thickness measuring device comprises a collimated, variable wavelength light source and a photo detector with a signal intensity output.

21. The method of claim 20 wherein said collimated variable wavelength light source reflects a beam of light from a designated area on said wafer attached to said rotatable wafer carrier and onto said photo detector.

22. The method of claim 20 wherein said signal intensity output of said photo detector is a measure of thickness of a dielectric layer over said designated area on said wafer.

* * * * *